United States Patent [19]
Mun et al.

[11] Patent Number: 5,491,435
[45] Date of Patent: Feb. 13, 1996

[54] DATA SENSING CIRCUIT WITH ADDITIONAL CAPACITORS FOR ELIMINATING PARASITIC CAPACITANCE DIFFERENCE BETWEEN SENSING CONTROL NODES OF SENSE AMPLIFIER

[75] Inventors: Zin-Suk Mun; Myung-Ho Bae, both of Kyungki, Rep. of Korea

[73] Assignee: Samsung Electronics Co., Ltd., Suwon, Rep. of Korea

[21] Appl. No.: 341,086

[22] Filed: Nov. 17, 1994

[30] Foreign Application Priority Data

Nov. 17, 1993 [KR] Rep. of Korea .................. 24484/1993

[51] Int. Cl.⁶ .................................................. G01R 19/00
[52] U.S. Cl. .................. 327/55; 327/51; 327/57; 365/203; 365/207; 365/210
[58] Field of Search .................. 327/50, 51, 52, 327/53, 54, 55, 56, 57, 58; 365/203, 207, 210, 189.01

[56] References Cited

U.S. PATENT DOCUMENTS

| | | | |
|---|---|---|---|
| 4,857,768 | 8/1989 | Griffith et al. ........................... | 327/51 |
| 4,918,341 | 4/1990 | Galbraith et al. ...................... | 307/530 |
| 4,982,367 | 1/1991 | Miyatake .................................. | 365/210 |
| 5,007,024 | 4/1991 | Tanaka et al. .......................... | 365/210 |
| 5,010,523 | 4/1991 | Yamauchi ................................. | 365/208 |
| 5,177,708 | 1/1993 | Furutani et al. ......................... | 365/205 |
| 5,200,923 | 4/1993 | Sekiguchi ................................. | 365/210 |
| 5,241,506 | 8/1993 | Motegi et al. ........................... | 365/210 |

*Primary Examiner*—Timothy P. Callahan
*Assistant Examiner*—Kenneth B. Wells
*Attorney, Agent, or Firm*—Cushman Darby & Cushman

[57] ABSTRACT

A data sensing circuit for a semiconductor memory device having complementary bit lines, including a PMOS sense amplifier connected between the complementary bit lines, an NMOS sense amplifier connected between the complementary bit lines, a bit line equalization and precharge circuit connected between the complementary bit lines, a sense amplifier equalization and precharge circuit connected between sensing control nodes of the PMOS and NMOS sense amplifiers, a plurality of first capacitors, a plurality of second capacitors, a plurality of first fuses connected between the sensing control node of the PMOS sense amplifier and respective ones of the first capacitors, a plurality of second fuses connected between the sensing control node of the NMOS sense amplifier and respective ones of the second capacitors. Selected ones of the first and/or second fuses can be selectively blown to thereby couple selected ones of the first and/or second capacitors to the sensing control nodes of the PMOS and NMOS sense amplifiers, respectively, to thereby equalize the capacitances of the sensing control nodes even when they have different parasitic capacitances.

5 Claims, 2 Drawing Sheets

DATA SENSING CIRCUIT WITH ADDITIONAL CAPACITORS FOR ELIMINATING PARASITIC CAPACITANCE DIFFERENCE BETWEEN SENSING CONTROL NODES OF SENSE AMPLIFIER

BACKGROUND OF THE INVENTION

The present invention relates generally to semiconductor memory devices, and, more particularly, to a method and circuit for sensing data in semiconductor memory devices.

Generally, the bit lines of a semiconductor memory device, e.g., a dynamic random access memory device (DRAM), are equalized and precharged in advance of a memory access operation, e.g., a read or write operation. The sensing control nodes of respective PMOS and NMOS sense amplifiers are also equalized and precharged in advance of a memory access operation. The accuracy and speed at which these equalizing and precharging functions are performed is an important factor with respect to the overall speed and reliability of the semiconductor memory device.

FIG. 1 is a detailed circuit diagram of a presently available data sensing circuit, which includes a PMOS sense amplifier 10, an NMOS sense amplifier 12, a bit line equalizing and precharging circuit 14, and a sense amplifier equalizing and precharging circuit 16.

With continuing reference to FIG. 1, the bit line equalizing and precharging circuit 14 is comprised of an NMOS transistor T1 whose channel is connected between complementary bit lines BL and /BL, and whose gate electrode is coupled to a primary equalizing control signal EQ1; and, two NMOS transistors T2 which are connected in series between the bit lines BL and /BL, whose gate electrodes are commonly coupled to the primary equalizing control signal EQ1, and whose source electrodes are commonly coupled to a precharge voltage, $V_{BL}$.

The PMOS sense amplifier 10 is comprised of PMOS transistors T3 and T4, which are connected in series between the bit lines BL and /BL. The gate electrode of the PMOS transistor T3 is coupled to the bit line /BL, and the gate electrode of the PMOS transistor T4 is coupled to the bit line BL. The source terminals of the PMOS transistors T3 and T4 are commonly coupled to a sensing control node LA.

The NMOS sense amplifier 12 is comprised of NMOS transistors T5 and T6 connected in series between the bit lines BL and /BL. The gate electrode of the NMOS transistor T5 is coupled to the bit line /BL, and the gate electrode of the NMOS transistor T6 is coupled to the bit line BL. The drain electrodes of the NMOS transistors T5 and T6 are commonly coupled to a sensing control node /LA. The capacitances $C_{BL}$ and $C_{BLB}$ represent the inherent (parasitic) capacitances of the bit lines BL and /BL, respectively.

A PMOS pull-up transistor T7 is connected in series between the sensing control node LA and a supply voltage Vcc. The gate electrode of the pull-up transistor T7 is coupled to a sensing control signal /φs. An NMOS pull-down transistor T8 is connected between the sensing control node /LA and a ground or other reference voltage Vss. The gate electrode of the pull-down transistor T8 is coupled to a sensing control signal φs, which is the complement of the sensing control signal /φs.

The sense amplifier equalizing and precharging circuit 16 is comprised of an NMOS transistor T9 whose channel is connected between the sensing control nodes LA and /LA; an NMOS transistor T10 which is connected between the control voltage $V_{BL}$ and the sensing control node LA; and, an NMOS transistor T11 which is connected between the precharge voltage $V_{BL}$ and the sensing control node/LA. The gate electrodes of the NMOS transistors T9, T10, and T11 are commonly coupled to a secondary equalizing control signal EQ2.

In operation, the data sensing circuit depicted in FIG. 1 works as follows. Namely, in advance of a memory access operation, the primary equalizing control signal EQ1 goes high, thereby simultaneously turning on the NMOS transistors T1, T2, and T3 of the bit line equalizing and precharging circuit 14, thereby equalizing and precharging the bit lines BL and/BL to the same voltage, i.e., $V_{BL}$. Subsequently, the secondary equalizing control signal EQ2 goes high, thereby simultaneously turning on the NMOS transistors T9, T10, and T11 of the sense amplifier equalizing and precharging circuit 16, thereby equalizing and precharging the sensing control nodes LA and/LA to the same voltage, i.e., $V_{BL}$. Thereafter, when a memory access operation is initiated, the sensing control signal φs goes high, and the complementary sensing control signal/φs goes low, thereby turning on the respective pull-down and pull-up transistors T8 and T7, thus raising the voltage level of the sensing control node LA to Vcc, and lowering the voltage level of the sensing control node/LA to Vss.

Capacitances $C_{LA}$ and $C_{LAB}$ are representative of the inherent (parasitic) capacitances of the circuits coupled to the sensing control nodes LA and/LA, respectively. Ideally, these two capacitances should be the same. However, in actual practice, these capacitances can differ, thereby inhibiting the speed of operation and degrading the reliability of the semiconductor memory device. In order to illustrate the problems caused by these differing capacitances, three separate cases will be described below, in conjunction with FIGS. 2A, 2B, and 3, namely, CASE 1 in which the capacitances $C_{LA}$ and $C_{LAB}$ are the same, CASE 2, in which the capacitance $C_{LA}$ of the sensing control node LA is lower than the capacitance $C_{LAB}$ of the sensing control node/LA, and, CASE 3, in which the capacitance $C_{LA}$ is higher than the capacitance $C_{LAB}$. The "sensing window" in FIG. 3 indicates the time period between the time the NMOS sense amplifier 12 begins its data sensing operation, and the time the PMOS sense amplifier 10 begins its data sensing operation, or vice versa.

With reference now to FIGS. 1, 2A, 2B, and 3, CASE 1 will now be described. More particularly, when the capacitances $C_{LA}$ and $C_{LAB}$ are equal, the sensing control nodes LA and/LA will be precharged to the same voltage level $V_{BL}$. When a memory access operation, e.g., a read operation, is initiated, the sensing control signal φs goes high, thereby turning on the pull-down transistor T8, and thus lowering (charging down) the sensing control node/LA to Vss; and, the complementary sensing control signal/φs goes low, thereby turning on the pull-up transistor T7, and thus raising the sensing control node LA to Vcc. As can be seen in FIG. 2A, since the starting voltage of the sensing control nodes LA and/LA is the same at the start of the read operation, the sensing control node LA reaches full Vcc, and the sensing control node/LA reaches full Vss. Then, the NMOS sense amplifier 12 begins its operation, and shortly thereafter, the PMOS sense amplifier 10 begins its operation. Because the sensing control node LA is at full Vcc, and the sensing control node/LA is at full Vss when the operation of the sense amplifiers 10 and 12 begins, the bit lines BL and/BL are driven to full Vcc and full Vss, respectively, or vice versa, depending upon the binary value ("1" or "0") of the data read out of the selected memory cell (not shown) of the semiconductor memory device, as can be seen in FIG. 2B.

With reference now to FIGS. 1, 2A, 2B, and 3, CASE 2 will now be described, i.e., the capacitance $C_{LA}$ is greater than the capacitance $C_{LAB}$. In this case, the the sensing control nodes LA and/LA will be precharged to a voltage level greater than $V_{BL}$. Consequently, when a read operation is initiated, the sensing control node LA will be charged up to a voltage greater than Vcc, and the sensing control node/LA will be charged down to a voltage greater than Vss, as can be seen in FIG. 2A. Because the sensing control node LA is greater than Vcc, and the sensing control node/LA is greater than Vss when the operation of the sense amplifiers 10 and 12 begins, the bit lines BL and/BL are driven to voltages greater than Vcc and Vss, respectively, or vice versa, depending upon the binary value ("1" or "0") of the data read out of the selected memory cell (not shown) of the semiconductor memory device, as can be seen in FIG. 2B. Moreover, as can be seen in FIG. 3, the operation of the PMOS sense amplifier 10 begins before the operation of the NMOS sense amplifier 12, which increases the time required to perform the read operation, increases the noise level of the ground voltage terminal Vss, and can result in data read errors. Thus, as can be seen in FIG. 3, the "sensing window" with respect to CASE 2 is much larger than it is with respect to CASE 1.

With reference now to FIGS. 1, 2A, 2B, and 3, CASE 3 will now be described, i.e., the capacitance $C_{LA}$ is less than the capacitance $C_{LAB}$. In this case, the the sensing control nodes LA and/LA will be precharged to a voltage level less than $V_{BL}$. Consequently, when a read operation is initiated, the sensing control node LA will be charged up to a voltage less than Vcc, and the sensing control node/LA will be charged down to a voltage less than Vss, as can be seen in FIG. 2A. Because the sensing control node LA is less than Vcc, and the sensing control node/LA is less than Vss when the operation of the sense amplifiers 10 and 12 begins, the bit lines BL and/BL are driven to voltages less than Vcc and Vss, respectively, or vice versa, depending upon the binary value ("1" or "0") of the data read out of the selected memory cell (not shown) of the semiconductor memory device, as can be seen in FIG. 2B. Moreover, as can be seen in FIG. 3, although the operation of the NMOS sense amplifier 12 begins before the operation of the PMOS sense amplifier 10, as it should, the NMOS sense amplifier 12 latches too quickly, and the PMOS sense amplifier 10 latches too slowly, which increases the time required to perform the read operation, increases the noise level of the supply voltage terminal Vcc, and can result in data read errors. Thus, as can be seen in FIG. 3, the "sensing window" with respect to CASE 3 is also much larger than it is with respect to CASE 1.

Based on the above, it can be appreciated that there presently exists a need in the art for a data sensing circuit for a semiconductor memory device which overcomes the above-described drawbacks and shortcomings of the presently available data sensing circuit.

SUMMARY OF THE INVENTION

The present invention encompasses a data sensing circuit for a semiconductor memory device having complementary bit lines, including a PMOS sense amplifier connected between the complementary bit lines, an NMOS sense amplifier connected between the complementary bit lines, a bit line equalization and precharge circuit connected between the complementary bit lines, a sense amplifier equalization and precharge circuit connected between sensing control nodes of the PMOS and NMOS sense amplifiers, a plurality of first capacitors, a plurality of second capacitors, a plurality of first fuses connected between the sensing control node of the PMOS sense amplifier and respective ones of the first capacitors, a plurality of second fuses connected between the sensing control node of the NMOS sense amplifier and respective ones of the second capacitors. Selected ones of the first and/or second fuses can be selectively blown to thereby couple selected ones of the first and/or second capacitors to the sensing control nodes of the PMOS and NMOS sense amplifiers, respectively, to thereby equalize the capacitances of the sensing control nodes even when they have different parasitic capacitances.

BRIEF DESCRIPTION OF THE DRAWINGS

These and various other features and advantages of the present invention will be readily understood with reference to the following detailed description taken in conjunction with the accompanying drawings, in which like reference numerals designate like structural elements, and, in which.

DETAILED DESCRIPTION OF THE INVENTION

Figure 1:
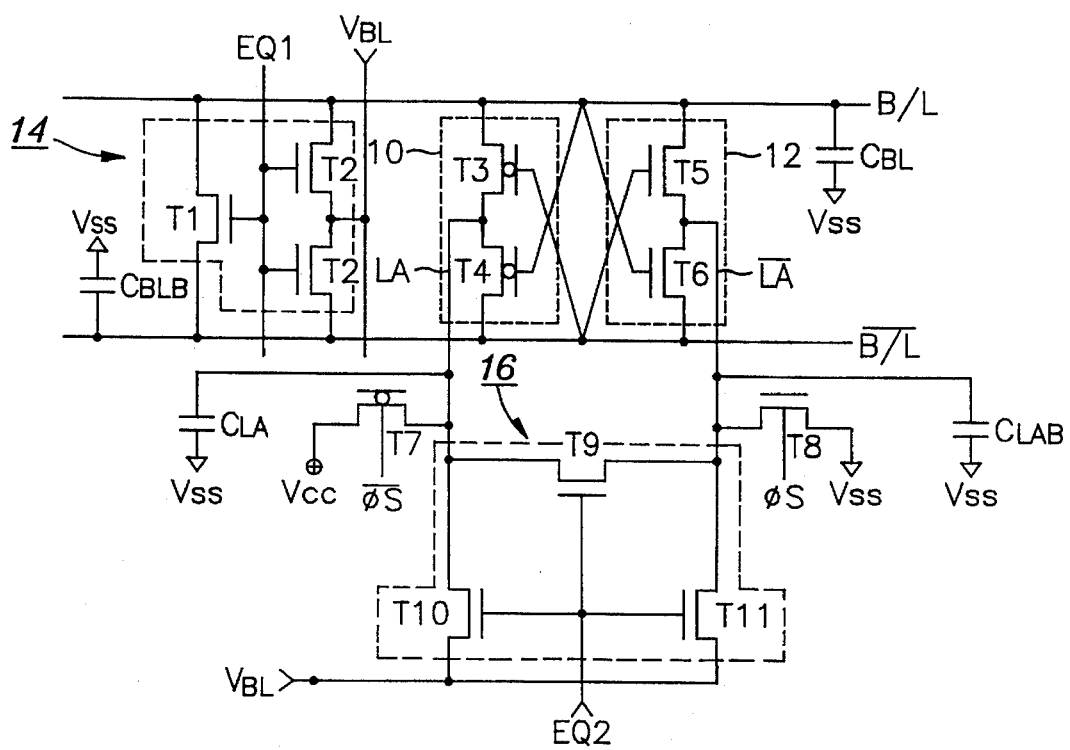
FIG. 1 is a circuit diagram of a presently available data sensing circuit.
Figure 2A:
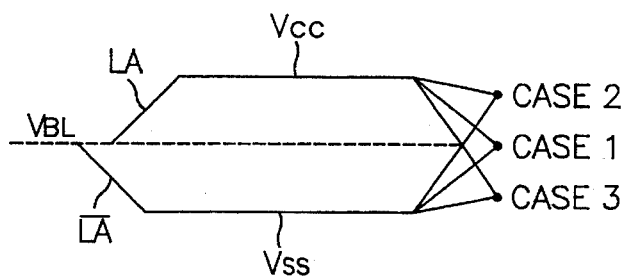
FIG. 2A is a waveform diagram depicting the voltage levels of complementary sensing control nodes of the data sensing circuit depicted in FIG. 1, for three different cases.
Figure 2B:
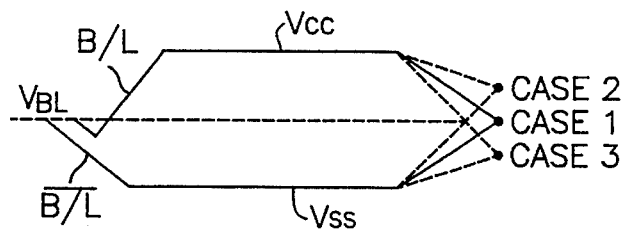
FIG. 2B is a waveform diagram depicting the voltage levels of complementary bit lines of the data sensing circuit depicted in FIG. 1, for the three different cases shown in FIG. 2A.
Figure 3:
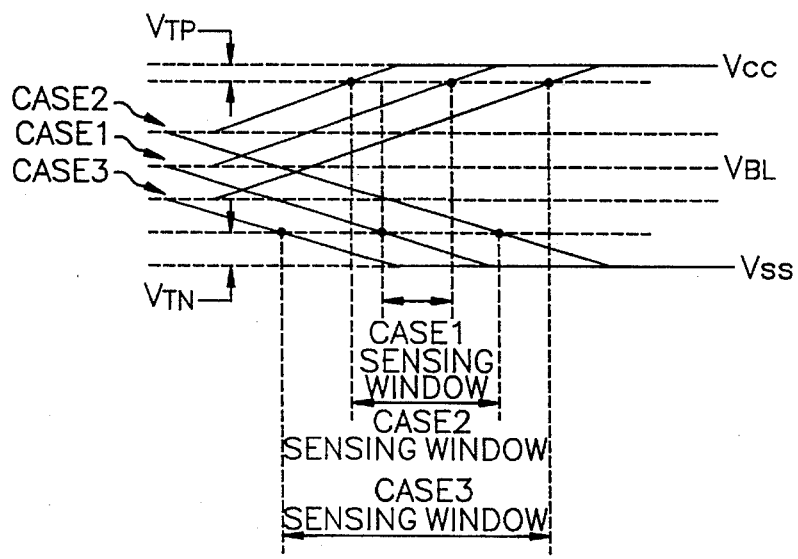
FIG. 3 is a waveform diagram depicting changes of the sensing window of the data sensing circuit depicted in FIG. 1, for the three different cases shown in FIGS. 2A and 2B; and, FIG. 4 is a circuit diagram of a data sensing circuit constructed in accordance with a preferred embodiment of the present invention.
Figure 4:
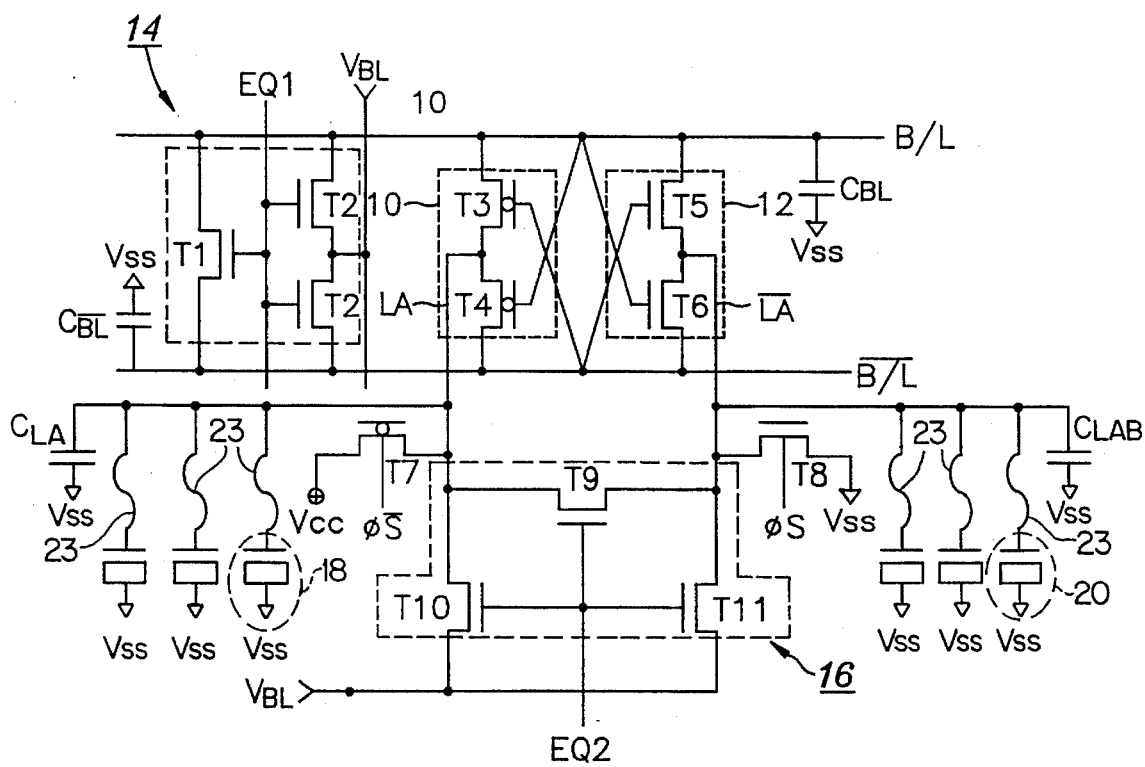

With reference now to FIG. 4, there can be seen a circuit diagram of a data sensing circuit constructed in accordance with a preferred embodiment of the present invention. As can be readily recognized by comparison of FIGS. 1 and 4, the only difference between the data sensing circuit of the present invention depicted in FIG. 4 and the previously described presently available data sensing circuit depicted in FIG. 1, is that the data sensing circuit of the present invention includes additional capacitors 18 and 20 coupled to the sensing control nodes LA and/LA, respectively. The capacitors 18 and 20 serve to compensate for differences between the inherent (parasitic) capacitances $C_{LA}$ and $C_{LAB}$ of the sensing control nodes LA and/LA, respectively. More particularly, if the potential of either of the sensing control node LA and/LA exceeds a predetermined threshold level, then the capacitors 18 and 20, respectively, store the excess charge, thus ensuring that the data sensing circuit will operate, at all times, in a manner corresponding to the ideal case, i.e., CASE 1 described hereinabove.

Although FIG. 4 depicts a single capacitor 18 coupled to the sensing control node LA, and a single capacitor 20 coupled to the sensing control node/LA, it will be readily appreciated by those skilled in the art that two or more capacitors can be selectively coupled to the respective sensing control nodes LA and/LA. For example, a plurality of first capacitors 18 could be connected by respective fuses 23 to the sensing control node LA, and a plurality of second capacitors 20 could be connected by respective fuses 23 to the sensing control node/LA. Depending upon the type of fuse which is used, the fuses 23 can either be selectively blown or fused (e.g., by means of a laser), to thereby disconnect or electrically couple corresponding ones of the first and second capacitors 18, 20 to the respective sensing control nodes LA,/LA. Of course, the selection of capacitors :18 and/or 20 to be disconnected or coupled to the sensing control nodes LA and/or/LA will depend upon the determined difference between the parasitic capacitances $C_{LA}$ and $C_{LAB}$, during or after fabrication of the semiconductor memory device.

Although a presently preferred embodiment of the present invention has been described in detail hereinabove, it should be clearly understood that many variations and/or modifications thereof which may appear to those skilled in the art will still fall within the spirit and scope of the present invention as defined in the appended claims.

What is claimed is:

1. A data sensing circuit for a semiconductor memory device having complementary bit lines, comprising:

a PMOS sense amplifier connected between the complementary bit lines, said PMOS sense amplifier having a sensing control node;

an NMOS sense amplifier connected between the complementary bit lines, said NMOS sense amplifier having a sensing control node;

a bit line equalization and precharge circuit connected between the complementary bit lines;

a sense amplifier equalization and precharge circuit connected between said sensing control nodes of said PMOS and NMOS sense amplifiers;

a plurality of first fuses each having a first end connected to said sensing control node of said NMOS sense amplifier, and a second end;

a plurality of second fuses each having a first end connected to said sensing control node of said PMOS sense amplifier, and a second end;

a plurality of first capacitors connected to said second end of respective ones of said first fuses;

a plurality of second capacitors connected to said second end of respective ones of said second fuses; and, wherein selected ones of said first and/or second fuses can be selectively blown to thereby couple selected ones of said first and/or second capacitors to said sensing control nodes of said PMOS and NMOS sense amplifiers, respectively, to thereby equalize the capacitances of said sensing control nodes of said PMOS and NMOS sense amplifiers, even when said sensing control nodes of said PMOS and NMOS sense amplifiers have different parasitic capacitances.

2. The data sensing circuit as set forth in claim 1, wherein said first capacitors are adapted to store excess charge due to the potential of said sensing control node of said PMOS sense amplifier exceeding a first predetermined threshold voltage.

3. The data sensing circuit as set forth in claim 2, wherein said second capacitors are adapted to store excess charge due to the potential of said sensing control node of said NMOS sense amplifier exceeding a second predetermined threshold voltage.

4. The data sensing circuit as set forth in claim 3, wherein said first and second predetermined threshold voltages are the same.

5. The data sensing circuit as set forth in claim 4, further comprising:

a pull-up transistor coupled between a first voltage and said sensing control node of said PMOS sense amplifier; and, a pull-down transistor coupled between a second voltage and said sensing control node of said NMOS sense amplifier.

* * * * *